US012795864B2

(12) United States Patent
Sun et al.

(10) Patent No.: US 12,795,864 B2
(45) Date of Patent: Nov. 10, 2026

(54) CONTAINERIZED LIQUID-COOLING DATA CENTER AND CONTROL METHOD THEREFOR

(71) Applicant: Hangzhou Dare Rouhan Technology Co., Ltd., Hangzhou (CN)

(72) Inventors: Minghui Sun, Hangzhou (CN); Shuwei Liu, Hangzhou (CN); Sheng Li, Hangzhou (CN)

(73) Assignee: Hangzhou Dare Rouhan Technology Co., Ltd., Hangzhou (CN)

( * ) Notice: Subject to any disclaimer, the term of this patent is extended or adjusted under 35 U.S.C. 154(b) by 288 days.

(21) Appl. No.: 18/423,338

(22) Filed: Jan. 26, 2024

(65) Prior Publication Data

US 2024/0349464 A1 Oct. 17, 2024

(30) Foreign Application Priority Data

Apr. 12, 2023 (CN) ......................... 202310386141.0

(51) Int. Cl.
*H05K 7/20* (2006.01)
*H05K 7/14* (2006.01)

(52) U.S. Cl.
CPC ....... *H05K 7/20827* (2013.01); *H05K 7/1497* (2013.01); *H05K 7/20281* (2013.01); *H05K 7/20327* (2013.01); *H05K 7/2039* (2013.01); *H05K 7/20836* (2013.01); *H05K 7/2079* (2013.01)

(58) Field of Classification Search
CPC ........... H05K 7/20827; H05K 7/20327; H05K 7/2039; H05K 7/20836; H05K 7/2079; H05K 7/20763; H05K 7/1497; H05K 7/20281; F24D 19/1015
See application file for complete search history.

(56) References Cited

U.S. PATENT DOCUMENTS 8,582,298 B2 11/2013 Facusse et al.
9,019,703 B2 * 4/2015 Petruzzo .................. G06F 1/20 361/695
10,833,940 B2 11/2020 Cencini et al.
11,231,693 B2 1/2022 Shapiro et al.
2008/0029250 A1 * 2/2008 Carlson ................ H05K 7/2079 165/104.33

(Continued)

*Primary Examiner* — Adam B Dravininkas

(57) ABSTRACT

A containerized liquid-cooling data center includes a computational power server cabinet system, a pump station control system, a plate heat exchanger unit and a power distribution cabinet unit that are disposed within a container, and a liquid cooling system disposed outside the container. The computational power server cabinet system includes a plurality of modules operating independently, each of which includes a plurality of server cabinets each corresponding to a power distribution branch. A plurality of power distribution branches in a same module are converged to a same power distribution bus, and a plurality of power distribution buses in the plurality of modules are converged into a same main power distribution bus, and a current switch is disposed on the main power distribution bus to control the main power distribution bus. The liquid cooling system cools and dissipates heat of the computational power server cabinet system through circulation of a medium.

8 Claims, 13 Drawing Sheets

(56) References Cited

U.S. PATENT DOCUMENTS

| | | | | |
|---|---|---|---|---|
| 2014/0029196 A1* | 1/2014 | Smith | H05K 7/20836 | 361/699 |
| 2015/0060009 A1* | 3/2015 | Shelnutt | H05K 7/20809 | 165/11.1 |
| 2017/0181328 A1* | 6/2017 | Shelnutt | G06F 1/20 | |
| 2018/0027701 A1* | 1/2018 | Kam | H05K 7/1485 | 454/184 |
| 2023/0105523 A1* | 4/2023 | Rogers | H05K 7/1488 | 29/592.1 |
| 2023/0200025 A1* | 6/2023 | Gao | H05K 7/1492 | 361/700 |

* cited by examiner

| Illustration | Name | Illustration | Name | Illustration | Name |
|---|---|---|---|---|---|
|  | Motor |  | Flange |  | Instrument |
|  | Water-water heat exchanger |  | Hose |  | Other flowmeter |
| 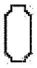 | Ion exchanger |  | Circulating water pipe | | |
|  | Nitrogen cylinder |  | Dividing line | | |
|  | Pressure container | 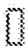 | Rapid joint | | |
| 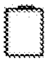 | Water supplementing container | | | | |
|  | Ball valve (normally open) |  | Electric valve |  | Butterfly valve |
|  | Ball valve (normally closed) |  | Exhaust Valve |  | Pump |
|  | Check valve |  | Drainage valve |  | Fan |
|  | Three-way valve (L type) |  | Safety valve |  | Compressor |
|  | Stop valve | 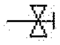 | Adjustable pressure reducing valve |  | Electric heater |
|  | Solenoid valve |  | Pressure regulating valve |  | Mechanical filter |

FIG. 6

| Initial Letter | Description | Initial Letter | Description | Initial Letter | Description | Initial Letter | Description |
|---|---|---|---|---|---|---|---|
| C | Container | V | Valve | F | Flow rate | A | Alert |
| H | Cooler or heater | W | Hose | L | Liquid level | C | Control |
| G | Fan | Z | Filter | P | Pressure | I | Scene indication |
| K | Actuated valve | R | Compressor | Q | Electrical conductivity | S | Switch quantity output |
| M | Motor | S | Throttle apparatus | T | Temperature | T | Analog quantity output |
| P | Pump | | | d | Differential | | |

FIG. 7

CONTAINERIZED LIQUID-COOLING DATA CENTER AND CONTROL METHOD THEREFOR

CROSS-REFERENCE TO RELATED APPLICATIONS

This application claims priority to Chinese Patent Application No. 202310386141.0 with a filing date of Apr. 12, 2023. The content of the aforementioned application, including any intervening amendments thereto, is incorporated herein by reference.

TECHNICAL FIELD

The present disclosure belongs to the technical field of temperature control, relates to a containerized data center, and in particular to a containerized liquid-cooling data center and a control method therefor.

BACKGROUND

In the era of big data explosion, data increases exponentially particularly with the development of the artificial intelligence (AI) technology. The chip technologies are urged to develop continuously, and the integration of chips is higher and higher. A great deal of computational power needs to be supported by a large number of server cabinets. A key solution to achieving a compromise between increasing computational power demand and limited data center carrying capability is to increase the power density of a single cabinet.

Limited by the construction area of a data center and environmental protection regulations, an increase in density becomes the key of improvement. Due to a large data throughput and a large quantity of computation, a data center, as the "brain" of emerging technologies such as AI and big data, is facing unprecedented challenges of energy consumption and heat dissipation. Such a development gives rise to a problem of heat dissipation, and a traditional air cooling heat dissipation system gradually becomes overburdened. In this context, a liquid cooling process system that uses a liquid cooling technology and devices such as a liquid-cooled server comes into being, which provides new solving ideas for the cooling of server devices with high heat release. In the field of data centers, there is no limitation of space before, and data centers are mostly provided with air cooling systems such as air conditioners to meet the requirement of cooling. With increasing density, a liquid cooling system is a brand-new concept, and there is no mature liquid-cooling data center available on the market at present.

SUMMARY OF PRESENT INVENTION

An objective of the present disclosure is to provide a containerized liquid-cooling data center and a control method therefor. Water is used as a cooling medium, which is easily available and low in cost. Moreover, with a reasonable layout structure, higher efficiency and lower energy consumption are achieved. A good heat dissipation processing way is provided for high density integration. With the efficient cooling effect of the liquid cooling technology, the use efficiency and stability of a server are effectively improved. Meanwhile, more servers are arranged in unit cabinet space. The computation efficiency of a unit cabinet is improved. The function of noise reduction is also achieved. Furthermore, recovery and utilization of waste heat may also create higher economic value, and the operation cost of the data center can be further reduced.

To resolve the above problem, the present disclosure adopts the following technical solutions. A containerized liquid-cooling data center for a cabinet-type plate cooling system includes a computational power server cabinet system, a pump station control system, a plate heat exchanger unit and a power distribution cabinet unit that are disposed within a container, and a liquid cooling system disposed outside the container.

The computational power server cabinet system includes a plurality of modules operating independently, each of which includes a plurality of server cabinets each corresponding to a power distribution branch; a plurality of power distribution branches in a same module are converged to a same power distribution bus, and a plurality of main power distribution buses in the plurality of modules are converged to a same main power distribution bus, and a current switch is disposed on the main power distribution bus to control the main power distribution bus.

The liquid cooling system cools and dissipates heat of the computational power server cabinet system through circulation of a medium.

The plate heat exchanger unit, as a bypass branch of the liquid cooling system, is configured to undertake part or all of a heat exchange function of the liquid cooling system, and is further configured for waste heat recovery and utilization.

The pump station control system provides power for the circulation of the medium.

In one embodiment, each independent module of the computational power server cabinet system includes a cabinet assembly, an electrical power distribution assembly, a switching assembly, and a water inlet and outlet assembly; the cabinet assembly is of a frame structure, in which a plurality of server cabinets are placed; a gap is formed between adjacent server cabinets; the water inlet and outlet assembly is communicated with a water inlet pipe and a water return pipe respectively; a first valve is disposed between the water inlet and outlet assembly and the water inlet pipe, and a second valve is disposed between the water inlet and outlet assembly and the water return pipe; and the electrical power distribution assembly is configured to electrically connect the server cabinets with the power distribution cabinet unit.

In one embodiment, the water inlet and outlet assembly includes a water inlet branch pipe and two water outlet branch pipes; the two water outlet branch pipes are defined as a first water outlet branch pipe and a second water outlet branch pipe; upper ends of the first water outlet branch pipe and the second water outlet branch pipe are communicated, where the first water outlet branch pipe is communicated with a high-temperature medium outlet pipe of the server cabinets; a lower end of the second water outlet branch pipe is communicated with the water return pipe; the water inlet branch pipe has a lower end connected to the water inlet pipe and an upper end closed, and a side of the water inlet branch pipe is communicated with a low-temperature medium inlet pipe of the server cabinets; the medium enters the server cabinets through the water inlet branch pipe, and after heat exchange within the server cabinet, the medium enters the first water outlet branch pipe from the high-temperature medium outlet pipe, and then enters the second water outlet branch pipe from the upper end thereof and subsequently flows out of the lower end thereof into the water return pipe.

In one embodiment, the cabinet assembly further includes a back plate and a tray; the back plate is disposed on a side of the water inlet and outlet assembly; the back plate has a lowermost end below an upper end of the water inlet and outlet assembly and an uppermost end above the upper end of the water inlet and outlet assembly; and the tray is disposed at an upper end of an uppermost server cabinet in each of the plurality of modules.

In one embodiment, the liquid cooling system includes a cooling tower, a water inlet pipe, a water return pipe, and a water distribution and collection pipe; the cooling tower supplies a low-temperature medium to the computational power server cabinet system through the water inlet pipe, and the low-temperature medium enters the server cabinets of the computational power server cabinet system through the water distribution and collection pipe and finally returns to the cooling tower through the water return pipe; a main filter, a flowmeter, a first pressure transmitter and a first temperature transmitter are disposed on the water inlet pipe; the main filter is configured to filter out impurities in the medium; the first pressure transmitter is configured to monitor a pressure and upload the pressure to the power distribution cabinet unit timely; the first temperature transmitter is adapted to monitor a water inlet temperature and upload the water inlet temperature to the power distribution cabinet unit timely; and a second pressure transmitter and a second temperature transmitter are disposed on the water return pipe; the second pressure transmitter is configured to monitor a pressure and upload the pressure to the power distribution cabinet unit timely; the second temperature transmitter is adapted to monitor a water outlet temperature and upload the water outlet temperature to the power distribution cabinet unit timely.

In one embodiment, the plate heat exchanger unit includes a bypass pipe and a plate heat exchanger; the bypass pipe has one end communicated with the water return pipe and the other end communicated with the plate heat exchanger as a high-temperature medium inlet, and the one end connected to the water return pipe is disposed between a main circulating water pump and the cooling tower; the plate heat exchanger is provided with two water outlets, one of which is communicated with the water inlet pipe and the other one of which serves as a heating water outlet, and the one end communicated with the water inlet pipe is disposed between the main filter and the cooling tower; a regulating valve is disposed on a pipe where the heating water outlet is located to control a heating flow rate; and the plate heat exchanger unit further has a heating water inlet for communicating with a supplemental heat source.

In one embodiment, the water inlet pipe and the water return pipe are converged at lower ends of the modules of the computational power server cabinet system; the water inlet pipe is detoured around a farthest module in the computational power server cabinet system with a tail end thereof being located at a module closest to the cooling system, and enters each independent module of the computational power server cabinet system.

In one embodiment, a water supplementing assembly is further disposed between the water inlet pipe and the water return pipe to communicate the two pipes; the water supplementing assembly includes a water supplementing pipe having one end disposed between the main filter of the water inlet pipe and the computational power server cabinet system and the other end disposed between the computational power server cabinet system and a main circulating water pump; a water supplementing tank, a liquid supplementing filter, a liquid supplementing pump, a check valve and an electric ball valve are disposed in sequence on the water supplementing pipe between the water inlet pipe and the water return pipe; and a safety valve is disposed between the water supplementing tank and the water inlet pipe.

A method for controlling a containerized liquid-cooling data center is provided, which includes operations in a manual mode and an automatic mode that are switchable.

In the manual mode, a main circulating water pump, a liquid supplementing pump, a fan in a container, a fan on a cooling tower and a spray pump on the cooling tower are started and stopped manually.

In an automatic mode, after a local start command or a remote start command is received, a liquid cooling system starts automatically; a running status of the liquid cooling system is monitored and a system failure is detected according to setting parameters; a programmable logic controller (PLC) monitors a temperature of cooling water and a system pressure, locally displays that the parameters of the liquid cooling system are out of limit timely, and turns on an error signal light; the parameters seriously out of limit that possibly affect safe operation of a cooled device are locally displayed, an error alerting signal light is on to automatically give an alert; and a control cabinet unit performs formal debugging according to the alert to realize optimization and improvement.

The main circulating water pump, the liquid supplementing pump and the fun on the cooling tower are automatically controlled by the PLC according to actual operating conditions.

A pump station control system controls start and stop of the fun on the cooling tower according to temperature from a temperature transmitter on a water inlet pipe and an outdoor temperature transmitter, but does not control a running state of the fun on the cooling tower.

The control method follows the following control principles:

- the main circulating water pump starts automatically; the control cabinet unit controls a frequency of the main circulating water pump by means of a proportional-integral-derivative (PID) controller, compares a set value with a reference value, and performs flow rate control according to a comparison result;
- the fun on the cooling tower starts automatically; the control cabinet unit controls a frequency of the fun on the cooling tower by means of the PID controller, compares a set value with a reference value, and performs temperature control according to a comparison result;
- the spray pump on the cooling tower is automatically turned on when a temperature of a temperature transmitter in the cooling tower is greater than a set value and automatically turned off when the temperature of the temperature transmitter is lower than the set value;
- a butterfly valve on a water return pipe is automatically opened when a temperature of a temperature transmitter on the water return pipe is greater than a set value and automatically closed when the temperature of the temperature transmitter on the water return pipe is lower than the set value; a butterfly valve on a bypass pipe is automatically opened and closed counter to the butterfly valve on the water return pipe;
- the liquid supplementing pump is automatically started to supplement a liquid when a pressure of a pressure transmitter on the water inlet pipe is greater than a set value and automatically stopped when the pressure of the pressure transmitter on the water inlet pipe is lower than the set value; a ball valve on a water supplementing pipe is opened and closed in a same direction with the liquid supplementing pump; and the fan in the container is automatically turned on when a temperature and a humidity of a temperature and humidity transmitter disposed in the container are greater than set values and automatically turned off when the temperature and the humidity of the temperature and humidity transmitter are lower than the set values.

Compared with the prior art, the present disclosure has the following advantages and positive effects:

1. The whole structure of the data center is modularly designed and modularized into the computational power server cabinet system, the pump station control system, the plate heat exchanger unit, the power distribution cabinet unit and the liquid cooling system. Each module may be independently assembled into a modular structure. A plurality of modules may be assembled simultaneously outside the container, and then arranged in the container for general connection and assembly after being assembled respectively. The assembling efficiency may be improved. Moreover, assembling outside the container is not limited by space so that the assembling efficiency can be further improved, and is convenient for subsequent repair. When local repair is needed, an individual module may be replaced and repaired. A point where maintenance is needed may be identified rapidly and replacement may be made thereto. On this basis, the computational power server cabinet system is further divided into a plurality of independent tanks disposed in parallel. Each module is runnable independently. The power distribution of each module is independent, and may be controlled by a switching assembly corresponding to the module. Meanwhile, the plurality of modules may also be controlled by the main power distribution bus. The plurality of modules are runnable simultaneously, and one or more of the modules may be selected to operate, which may be adjusted as needed, thereby reducing the energy consumption. Server cabinets within each module are disposed in parallel up and down. Each server cabinet is coupled to the same power distribution bus through a power distribution branch. When one of the server cabinets is out of order, it may be directly replaced without affecting the operation and connection of other server cabinets. The structure described above is equivalent to a three-stage modular arrangement of the whole structure. The assembling efficiency and the stability of the system are greatly improved, and subsequent maintenance cost is reduced.
2. In the present disclosure, when a water inlet pipe connects with each independent module, an independent control valve is provided. An independent control valve is also disposed between each module and the water return pipe. Thus, it is guaranteed that the liquid cooling system is independently runnable for cooling each module in the computational power server cabinet system. Each module operates independently, and a corresponding function is also independent such that an independent module is formed. Further, the module can be disassembled. A plurality of modules may coordinate with each other, and are independent of each other. The energy consumption is reduced.
3. According to the present disclosure, the power distribution way and structure are simple, and the operation is more convenient and efficient. The server cabinets in the computational power server cabinet system are coupled to the same power distribution bus. A plurality of power distribution buses are converged to the same main power distribution bus. When a plurality of containers are used in parallel, a plurality of main power distribution buses are further converged to a same main superior bus. The bus structure is simple, which is beneficial to modular connection, and the connection is more secure and stable.
4. The plate heat exchanger unit may serve as a heating unit to recover waste heat. When an external cold source of the liquid cooling system is insufficient to meet the requirement of a total heat dissipation quantity of the liquid cooling system, a high-temperature medium flows to the plate heat exchanger unit through a bypass pipe of the liquid cooling system, exchanges heat with an outside low-temperature fluid through the plate heat exchanger unit to take way part of heat to satisfy the total heat dissipation quantity required by the liquid cooling system. The high-temperature medium then becomes a low-temperature medium which enters a pipe before the water distribution and collection pipe again, and then enters a transport pipe for the low-temperature medium, thereby forming the circulation of the medium at the plate heat exchanger unit. When heating is needed, the external cold source is switched off, and the total heat dissipation quantity of the liquid cooling system is undertaken by the plate heat exchanger unit. Through heat exchange with an external low-temperature fluid, a total heat load released when the computational power server cabinet system operates is taken away; and meanwhile, the external low-temperature fluid is heated to form a high-temperature fluid for heating. Energy is saved, and a cost per unit computation power is reduced.
5. The water inlet and outlet assembly is capable of guaranteeing that paths along which a medium travels when cooling server cabinets are the same, thus ensuring uniform flow as much as possible. A continuous cooling effect can be guaranteed, and a better balance is achieved. More preferably, exhaust valves are disposed on the water inlet branch pipe, the first water outlet branch pipe and the second water outlet branch pipe to empty air in the pipes, thereby guaranteeing smooth flow of a medium, guaranteeing a density of the medium, avoiding excessive air from corroding the pipes and prolonging the service life of the pipes.
6. The back plate is provided to effectively prevent a leaking medium from splashing on the main power distribution bus and the tray is provided to receive the medium and guide the flow of the medium to a certain extent in case of a large quantity of the medium, thus avoiding the main power distribution bus from being affected while protecting a protector to a certain extent. The safety performance is improved and a potential safety hazard is avoided, which are crucial and also are important requirements for the application of a bus.
7. In the present disclosure, the water inlet pipe is detoured around the farthest module in the computational power server cabinet system with a tail end thereof being located at a module closest to the cooling system, and enters each independent module of the computational power server cabinet system. Such a structure design is equivalent to that the water inlet pipe is detoured. In the container having a limited and compact space, the water inlet pipe is detoured because of needs of reducing a pressure balance of water intake, reducing impact to the water return pipe, and avoiding problems such as piping during water intake, thereby being conducive to keep a pressure balanced in the water return pipe. It is significantly helpful for the safety and the service life of the water inlet pipe to keep a constant water intake velocity.

8. In the present disclosure, a power of the main circulating water pump is selected according to a medium flow rate and a medium transport path. The power of the main circulating water pump is determined, and a specification of the main circulating water pump is determined according to the power. A total power is greater than a theoretically calculated power. Low frequency operation is selected to reduce vibration, guaranteeing better stability within the whole system. The performance of each component is more reliable, and the vibration of the whole container is reduced.

BRIEF DESCRIPTION OF THE DRAWINGS

The accompanying drawings which constitute a part of the description of the present disclosure are intended to provide further understanding of the present disclosure. The exemplary embodiments of the present disclosure and descriptions thereof are intended to be illustrative of the present disclosure and do not constitute an undue limitation of the present disclosure. In the drawings:

FIG. 6 is a table showing illustrations and names of graphic symbols according to the present disclosure;

FIG. 7 is a table showing initial letters of alphabetic symbols and descriptions thereof according to the present disclosure;

REFERENCE NUMERALS

Figure 1:
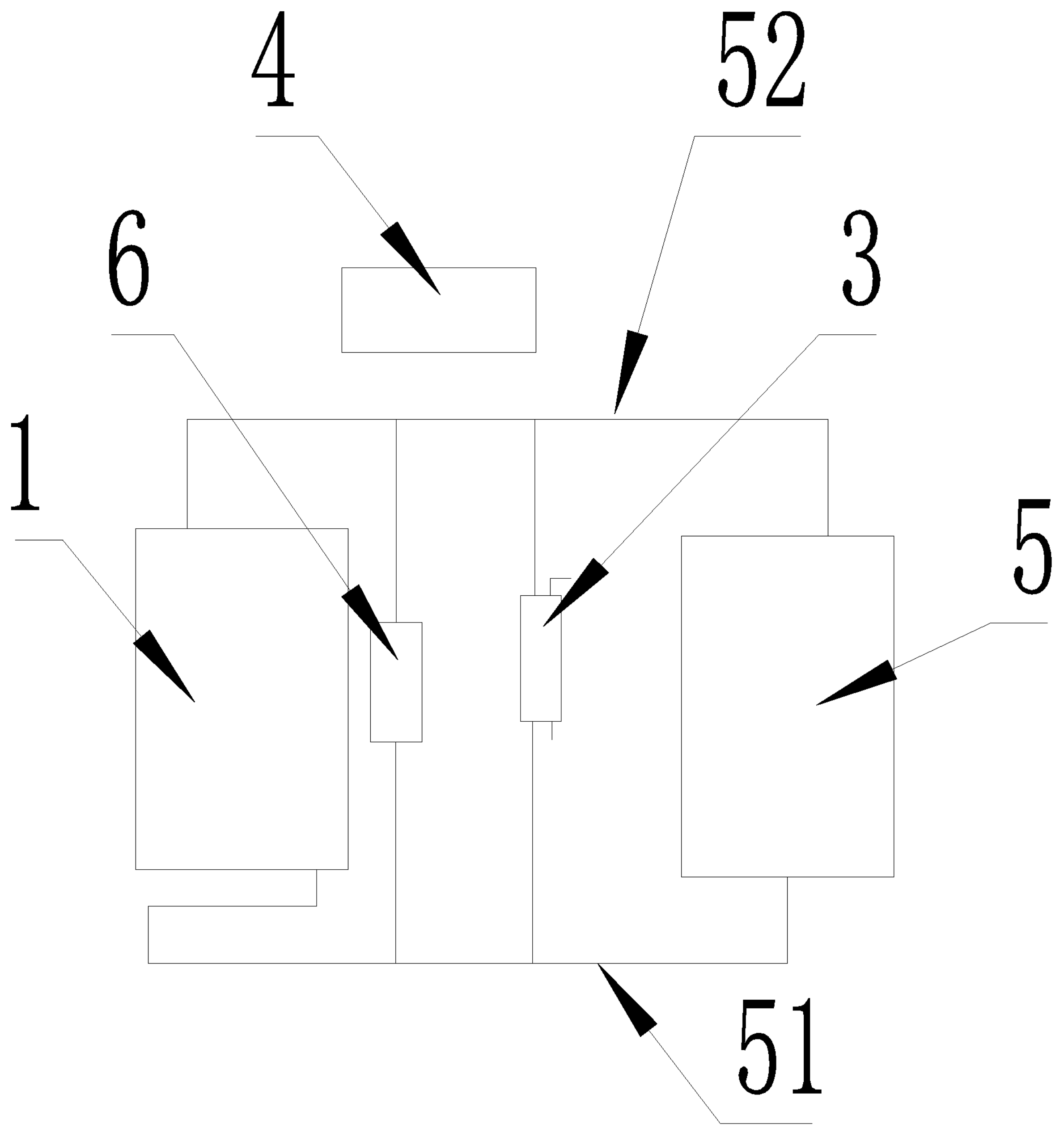
FIG. 1 is a diagram illustrating a structural layout of a containerized liquid-cooling data center according to the present disclosure.
Figure 2:
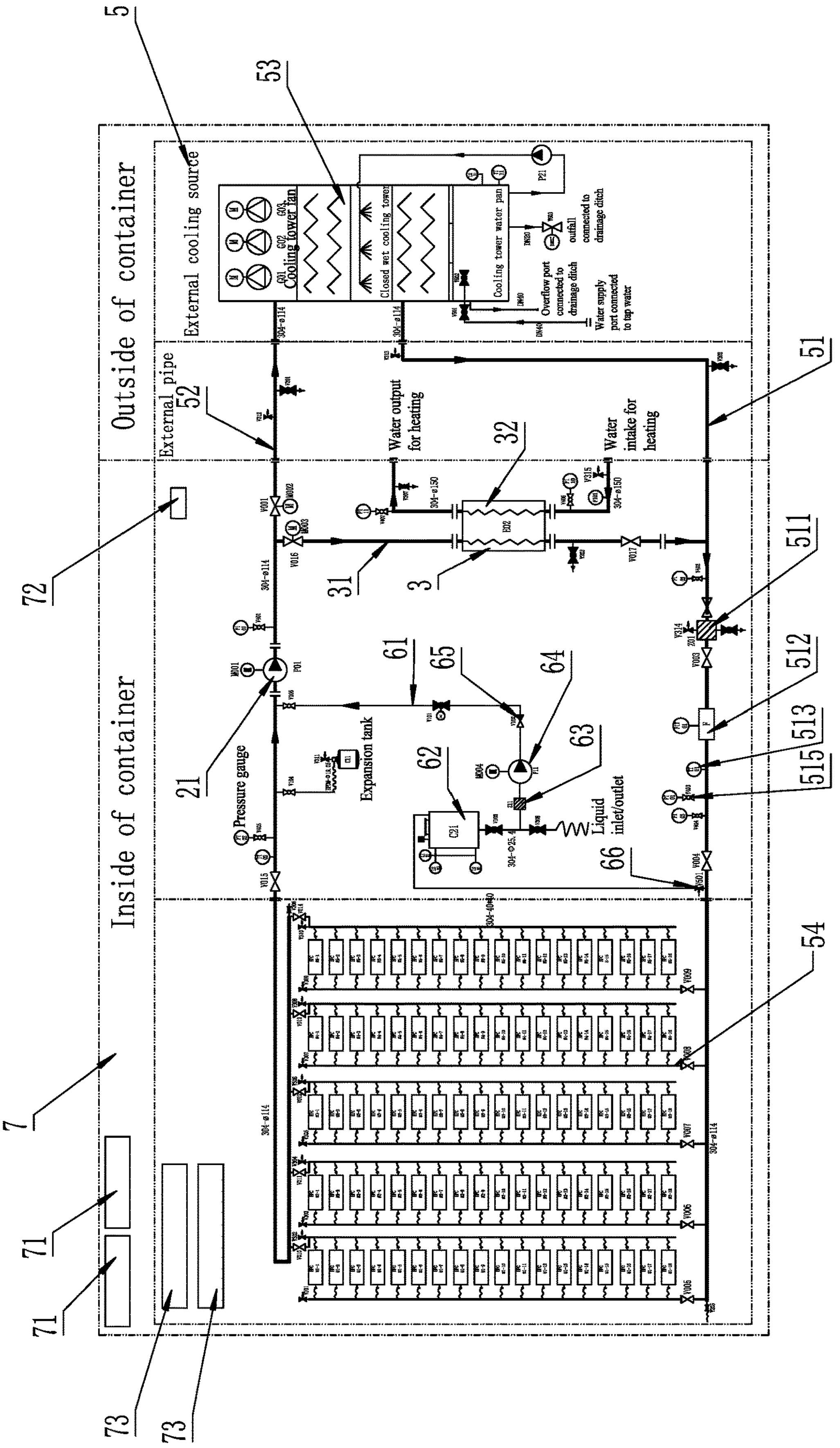
FIG. 2 is a diagram illustrating a principle of a containerized liquid-cooling data center according to the present disclosure.
Figure 3:
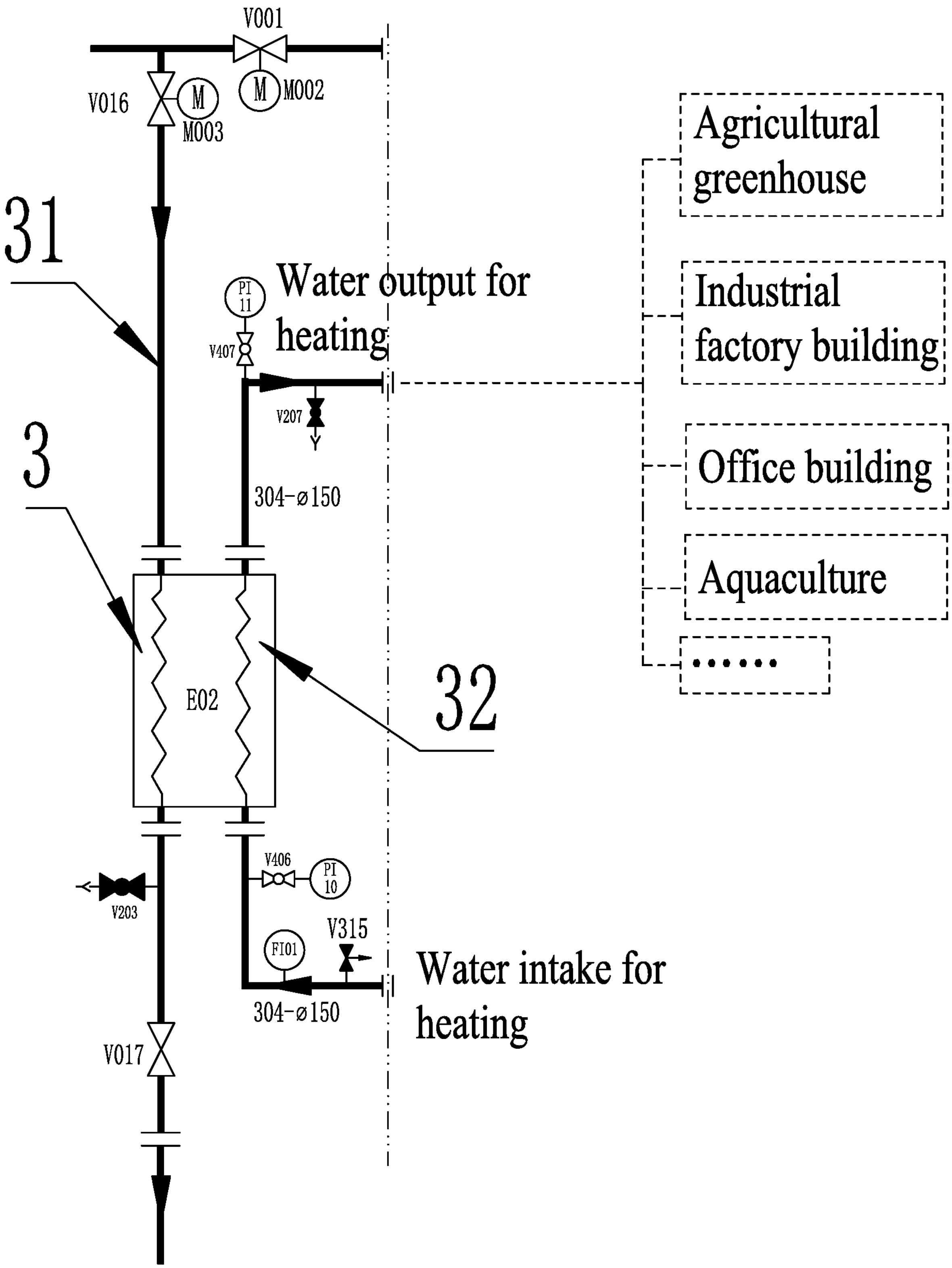
FIG. 3 is a diagram illustrating a principle of a plate heat exchanger unit according to the present disclosure.
Figure 4:
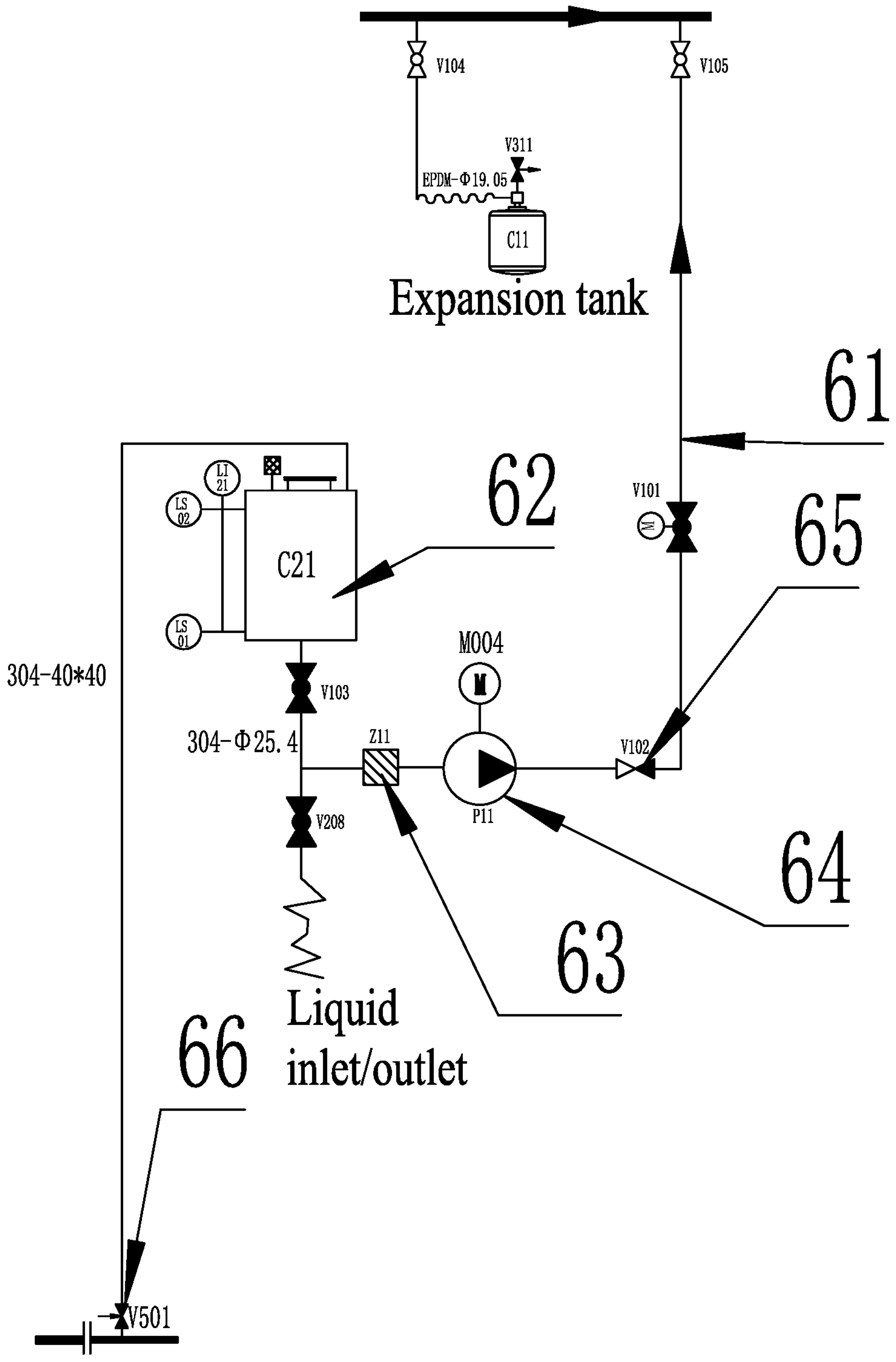
FIG. 4 is a diagram illustrating a principle of a water supplementing assembly according to the present disclosure.
Figure 5:
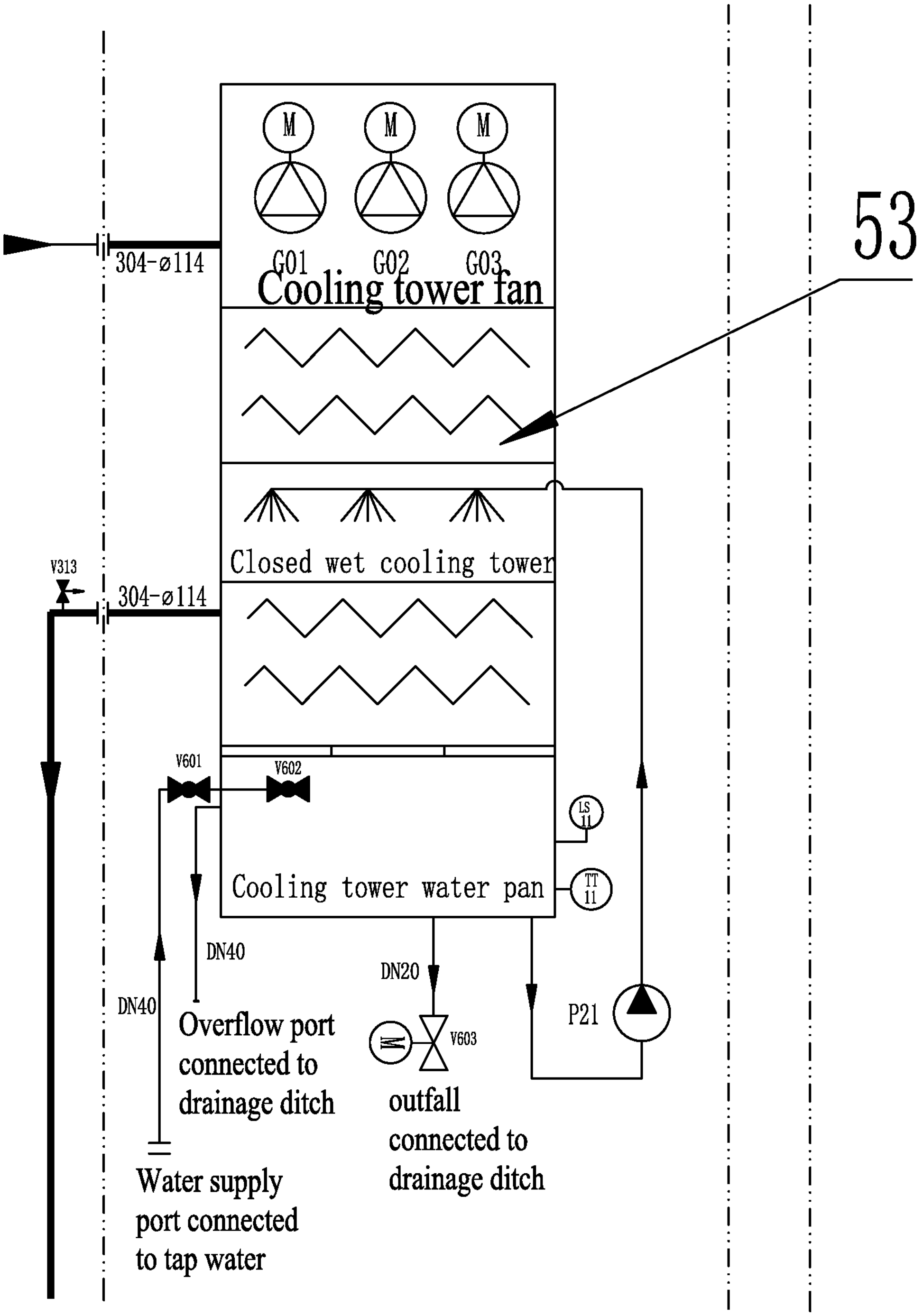
FIG. 5 is a structural schematic diagram of a cooling tower according to the present disclosure.
Figure 8:
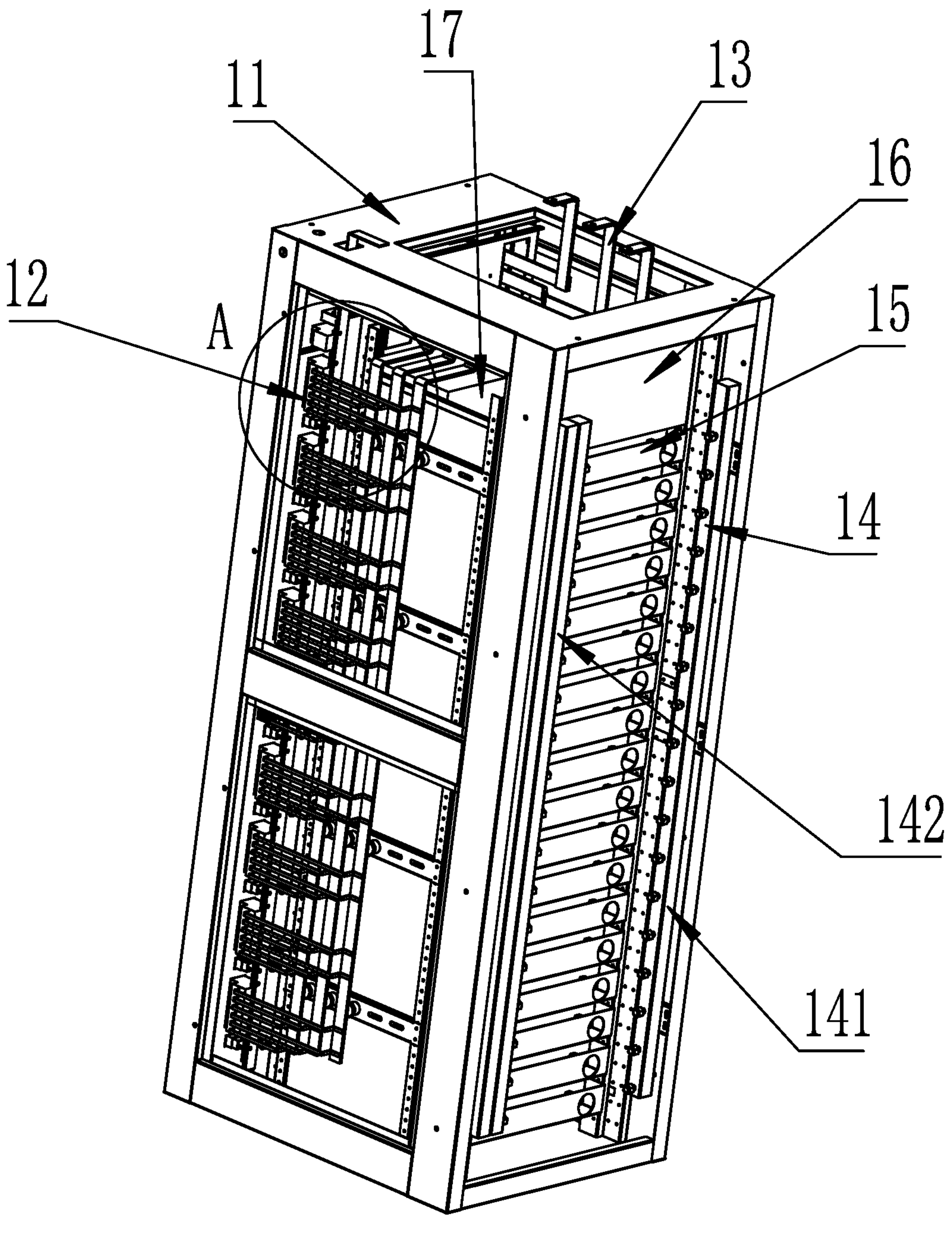
FIG. 8 is a structural schematic diagram of one module of a computational power server cabinet system according to the present disclosure viewed from a side.
Figure 9:
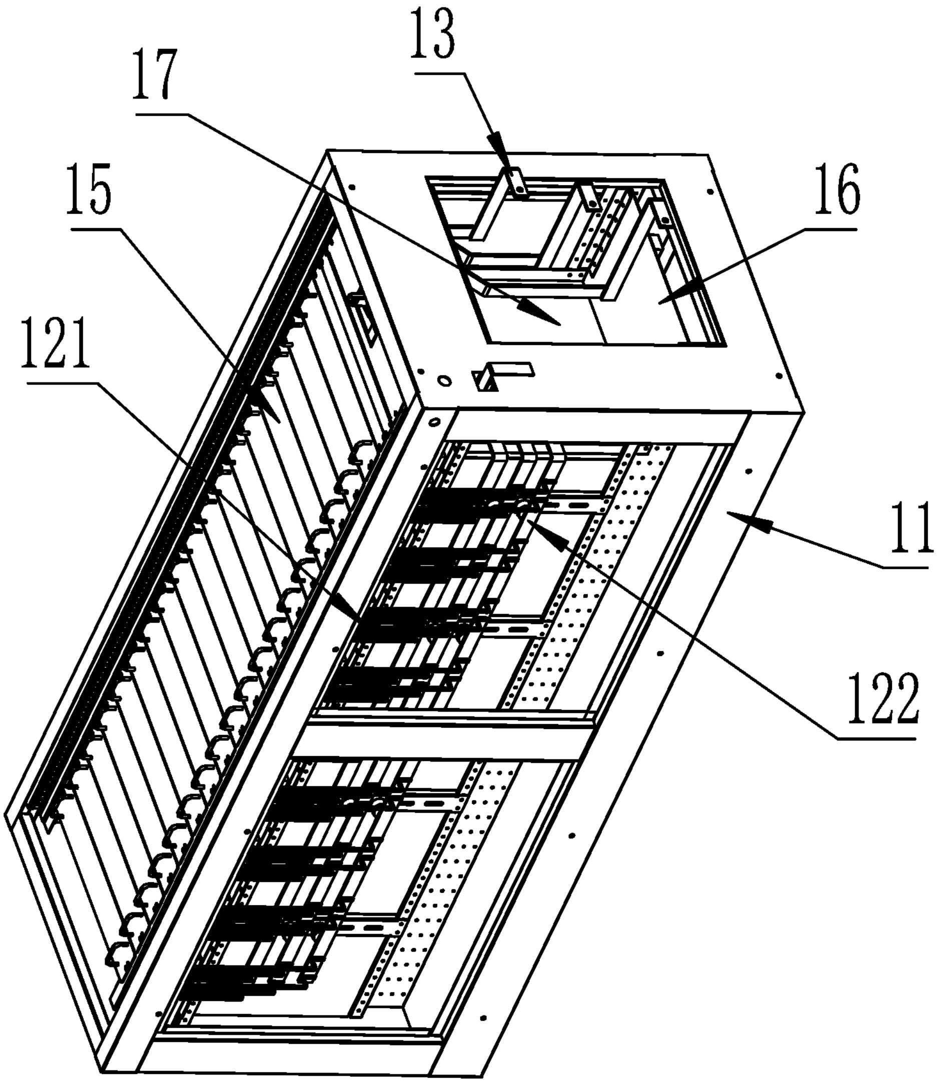
FIG. 9 is a structural schematic diagram of one module of a computational power server cabinet system according to the present disclosure viewed from the top.
Figure 10:
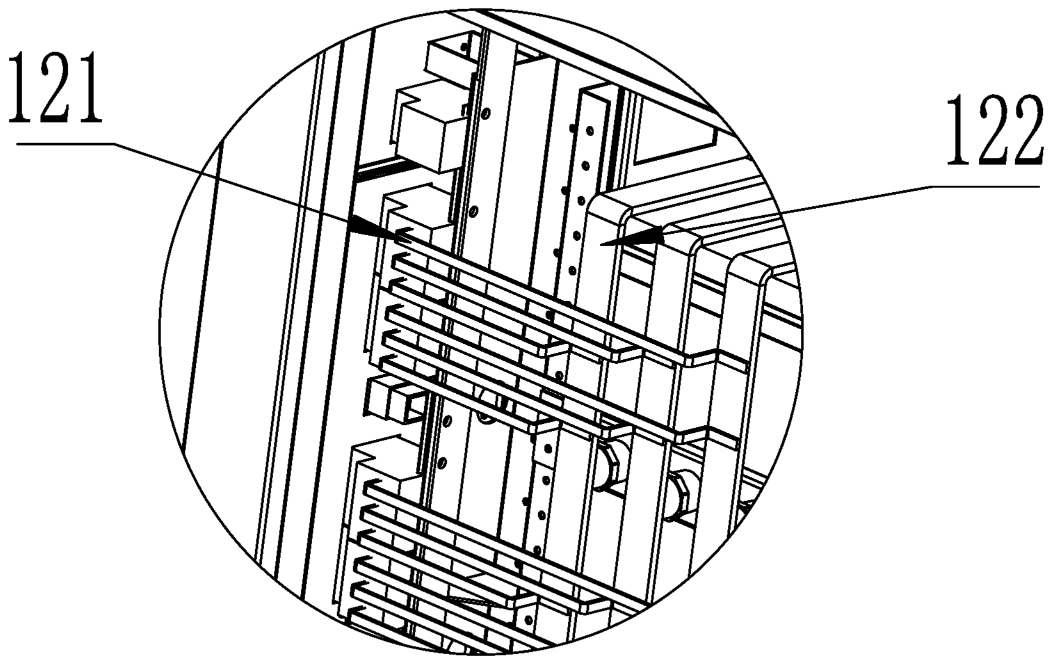
FIG. 10 is a detail diagram of area A in FIG. 8 according to the present disclosure.
Figure 11:
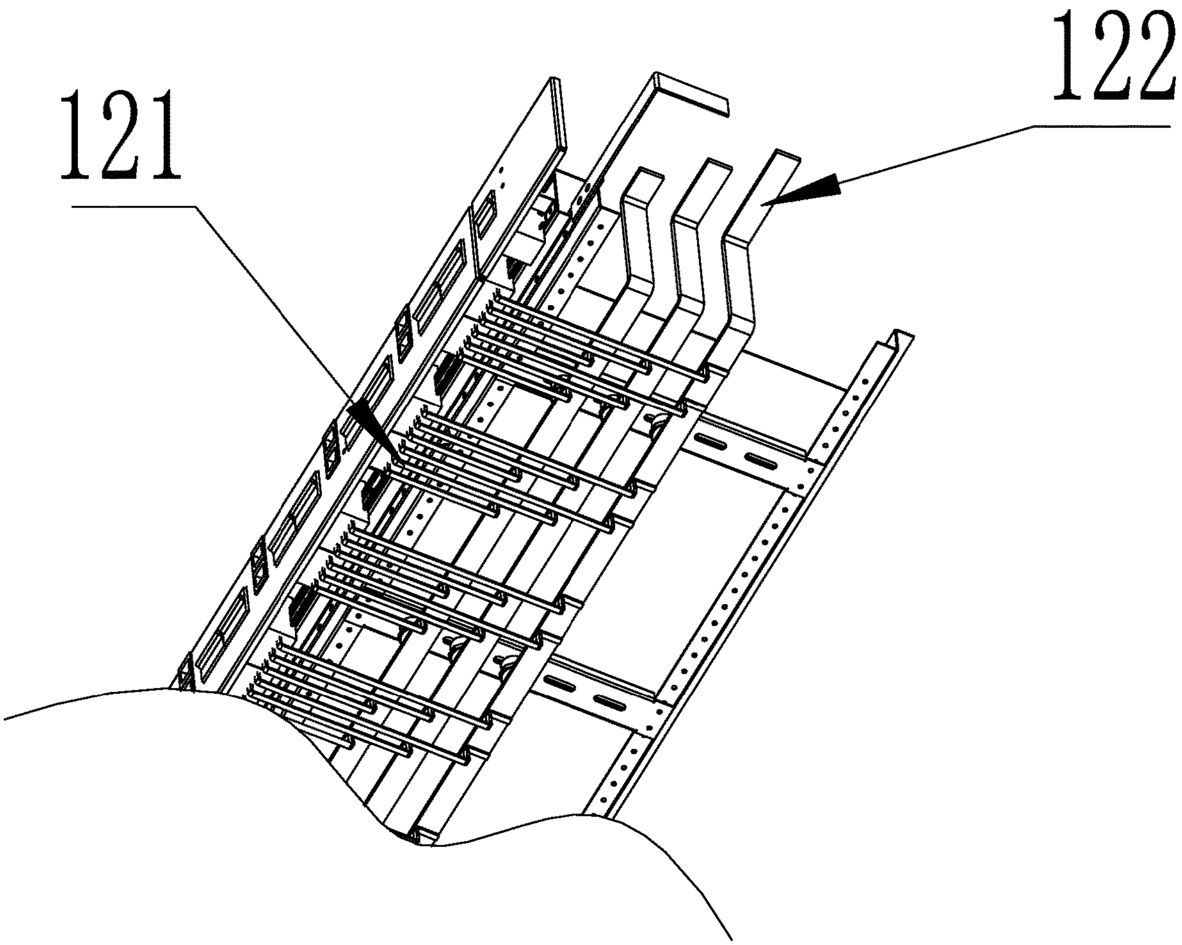
FIG. 11 is a partial structural schematic diagram of an electrical power distribution assembly according to the present disclosure.
Figure 12:
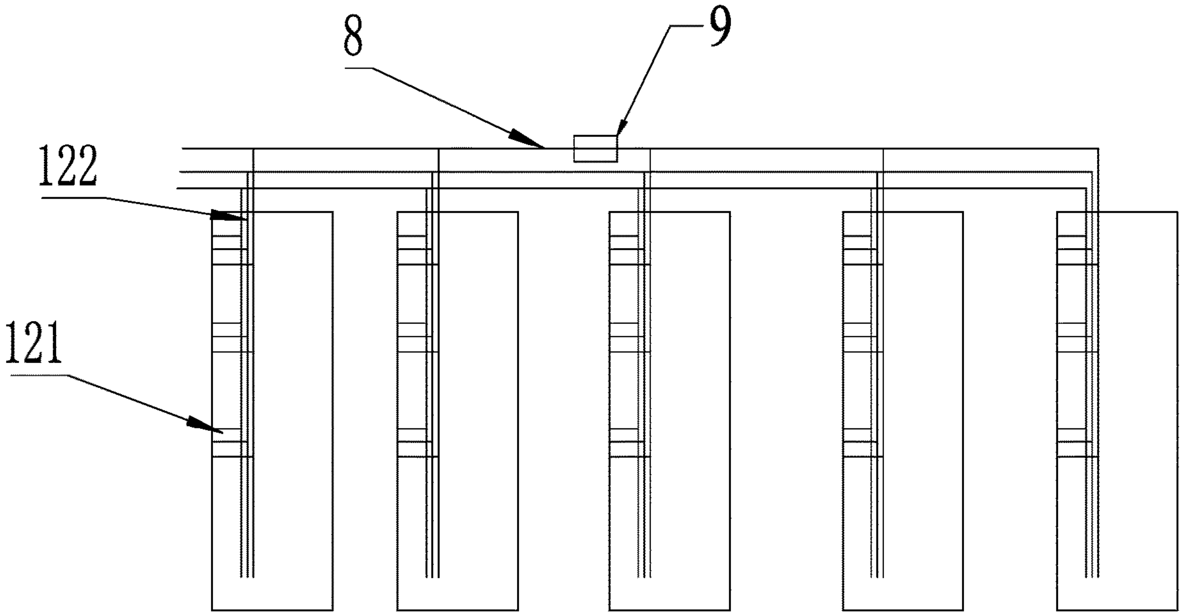
FIG. 12 is a schematic diagram illustrating a layout of buses in a computational power server cabinet system according to the present disclosure.

1—computational power server cabinet system; 11—cabinet assembly; 12—electrical power distribution assembly; 121—power distribution branch; 122—power distribution bus; 13—switching assembly; 14—water inlet and outlet assembly; 141—water inlet branch pipe; 142—water outlet branch pipe; 15—server cabinet; 16—back plate; 17—tray; 2—pump station control system; 21—main circulating water pump; 3—plate heat exchanger unit; 31—bypass pipe; 32—plate heat exchanger; 33—regulating valve; 4—power distribution cabinet unit; 5—liquid cooling system; 51—water inlet pipe; 511—main filter; 512—turbine flowmeter; 513—temperature transmitter; 515—pressure transmitter; 52—water return pipe; 53—cooling tower; 54—water distribution and collection pipe; 6—water supplementing assembly; 61—water supplementing pipe; 62—water supplementing tank; 63—water supplementing filter; 64—water supplementing pump; 65—check valve; 66—safety valve; 7—container; 71—fan; 72—temperature and humidity transmitter; 73—leakage detection transmitter; and 8—main power distribution bus; 9—current switch.

DETAILED DESCRIPTION OF THE EMBODIMENTS

It should be noted that embodiments in the present disclosure or features in the embodiments may be combined with one another without conflict.

It should be understood that in the description of the present disclosure, terms such as “central”, “longitudinal”, “transverse” “upper”, “lower”, “front”, “rear”, “left”, “right” “vertical”, “horizontal”, “top”, “bottom”, “inside” and “outside” indicate the orientations or positional relationships based on the drawings, and these terms are merely intended to facilitate and simplify the description of the present disclosure, rather than to indicate or imply that the mentioned apparatus or element must have a specific orientation or must be constructed and operated in a specific orientation, and thus cannot be construed as limitations to the present disclosure. Moreover, terms such as “first” and “second” are used only for the purpose of description and cannot be understood as indicating or implying relative importance or implicitly indicating the number of technical features denoted. Thus, features defined with “first” and “second” may explicitly or implicitly include one or more of the features. In the description of the present disclosure, unless otherwise specified, “a plurality of” means two or more.

In the description of the present disclosure, it should be noted that, unless otherwise clearly specified, meanings of terms “mount”, “connected with”, and “connected to” should be understood in a board sense. For example, the connection may be a fixed connection, a removable connection, or an integral connection; may be a mechanical connection or an electrical connection; may be a direct connection or an indirect connection by using an intermediate medium; or may be intercommunication between two elements. A person of ordinary skill in the art may understand specific meanings of the above terms in the present disclosure based on a specific situation.

The specific embodiments of the present disclosure are described in detail below with reference to the accompanying drawings.

“Computational power” is normally regarded as data processing capability. Ranging from mobile phones and laptops to super computers, the computational power exists in various intelligent hardwater devices. Without the computational power, various kinds of software and hardwater cannot operate normally. Artificial intelligence (AI) is unlike water without a source and a tree without roots. AI needs to be supported by the computational power of a hardwater chip when completing each face recognition or each speech-to-text conversion.

Laptops available for ordinary people have different configurations with different prices, which mainly depend on differences of CPUs, graphics cards, internal storages and the like carried by products having different configurations. A laptop with a high-level configuration may have higher computational power, with which a game requiring a higher-level configuration can be played, and may run more internal storage consuming 3D and audio-visual software. A laptop with a low-level configuration may have insufficient computational power and can only run ordinary games and ordinary office software. For a same online game, the online game can be run more smoothly on a mobile phone with higher computational power, and if the computational power of a mobile phone is insufficient, the game may encounter lag.

A liquid cooling server refers to a liquid injected server, which is a server with heat dissipation by cool and heat exchange. Servers may be distinguished by physical form between a cold-plate type liquid cooled server and a fully-immersed liquid cooled server.

The cold-plate type liquid cooled server, also called a plate cooled server, uses a fluid as an intermediate heat transfer medium to transfer heat from a hot zone to a far zone for cooling. In this technology, the fluid is separated from an object to be cooled. The fluid is not in direct contact with an electronic device, and instead transfers heat of the object to be cooled to a coolant through a high-efficiency heat transfer component such as a liquid cooling plate. That is, a component with high heat release of a server is attached to a cold plate, and a liquid circulates within the cold plate to take away heat. Therefore, the cold-plate type liquid cooling technology is also referred to as an indirect liquid cooling technology. According to this technology, the coolant is directly guided to a heat source, and since the liquid has greater specific heat and a much higher heat dissipation speed than air, the cooling efficiency by the liquid is far higher than that through heat dissipation by air cooling. Heat transferred per unit volume (i.e., heat dissipation efficiency) is up to 1000 times. The problem of heat dissipation of servers at a high density can be effectively solved, and both energy consumption and noise of a cooling system can be reduced.

A plate heat exchanger, which is an efficient heat exchanger formed by a series of stacked metal sheets having a certain corrugated shape, is formed by stacking and holding down many stamped corrugated sheets using a frame and hold-down screws at certain intervals with a gasket disposed therearound for sealing. Holes at four corners of the sheets and the gasket form a distribution pipe and a collection pipe for a fluid. Meanwhile, cold and hot fluids are separated reasonably and allowed to flow in flow channels on two sides of each sheet, respectively. Heat exchange is achieved through the sheets. Thin rectangular channels are formed between various sheets, and heat exchange is achieved through the sheets. The plate heat exchanger is an ideal device for liquid-liquid heat exchange and liquid-steam heat exchange. The plate heat exchanger is high in heat exchange efficiency, low in heat loss, compact and light in structure, small in floor area, wide in application, and long in service life.

A cooling tower is an apparatus that uses water as a circulating coolant to absorb heat from a system and dissipate heat to the atmosphere to reduce the temperature of the water. The cooling tower is an evaporating heat dissipating apparatus that, in order to ensure normal operation of the system, dissipates industrial waste heat or waste heat released in a refrigeration air conditioner based on principles such as evaporating heat dissipation, convective heat transfer and radiative heat transfer. The evaporating heat dissipation is achieved in such a manner that water is in flowing contact with air for cold-heat exchange to produce steam and the steam volatilizes to take away heat. The apparatus is generally barrel-shaped and thus called the cooling tower.

As shown in FIG. 1 to FIG. 12, a containerized liquid-cooling data center for a cabinet-type plate cooling system includes a computational power server cabinet system 1, a pump station control system 2, a plate heat exchanger unit 3 and a power distribution cabinet unit 4 that are disposed within a container 7, and a liquid cooling system 5 disposed outside the container 7.

The computational power server cabinet system 1 is of a modular structure arranged in an up-and-down parallel stacking manner. The computational power server cabinet system 1 releases heat during working.

The liquid cooling system 5 provides a low-temperature medium. A preferred medium in the present disclosure is water. The low-temperature medium is distributed to each server cabinet in the computational power server cabinet system 1 through pipes under a pumping pressure of a pump station. The low-temperature medium enters each server cabinet of the computational power server cabinet system 1 through a water distribution and collection pipe and exchanges heat with the computational power server cabinet system 1 to take away heat. A high-temperature medium from the computational power server cabinet system 1 enters an external cold source (i.e., the liquid cooling system outside the container 7) through a pipe of the liquid cooling system 5 and exchanges heat with outdoor low-temperature air to become a low-temperature medium which enters the system to form a circulation. This process is repeated. With uninterrupted circulation, heat released by the computational power server cabinet system 1 during working is taken away.

The plate heat exchanger unit 3 serves as a heating unit. When an external cold source of the liquid cooling system 5 is insufficient to meet the requirement of a total heat dissipation quantity of the liquid cooling system 5, a high-temperature medium flows to the plate heat exchanger unit 3 through a bypass pipe of the liquid cooling system 5, exchanges heat with an outside low-temperature fluid through the plate heat exchanger unit 3, and takes way part of heat to satisfy the total heat dissipation quantity required by the liquid cooling system. The high-temperature medium then becomes a low-temperature medium which enters a pipe before a water distribution and collection pipe again, i.e., may enter a transport pipe for the low-temperature medium, thereby forming the circulation of the medium at the plate heat exchanger unit 3. When heating is needed, the external cold source is switched off, and the total heat dissipation quantity of the liquid cooling system 5 is undertaken by the plate heat exchanger unit 3. Through heat exchange with an external low-temperature fluid, a total heat load released when the computational power server cabinet system 1 operates is taken away; and meanwhile, the external low-temperature fluid is heated, and a high-temperature fluid is output to achieve the purpose of heating.

The plate heat exchanger unit 3 includes a bypass pipe 31 and a plate heat exchanger 32. The bypass pipe 31 has one end communicated with a water return pipe 52 and the other end communicated with the plate heat exchanger 32 as a high-temperature medium inlet, and the one end connected to the water return pipe 52 is disposed between a main circulating water pump and a cooling tower 53. The plate heat exchanger 32 is provided with two water outlets, one of which is communicated with a water inlet pipe 51 and the other one of which serves as a heating water outlet, and the one end communicated with the water inlet pipe 51 is disposed between a main filter 511 and the cooling tower 53. A regulating valve 33 is disposed on a pipe where the heating water outlet is located to control a heating flow rate. The plate heat exchanger unit 32 is further provided with a heating water inlet for use as a heating supplemental heat source.

In the data center, the computational power server cabinet system 1 is arranged centrally with a high density. After the computational power server cabinet system 1 is arranged within one container 7, the rated flow may be up to 900 KW. After cooling, more than 98% of heat released by the computational power server cabinet system 1 may be taken away. For example, 1000 KW of heat is released by the computational power server cabinet system 1, and after heat exchange, 98% of heat, i.e., 980 KW of heat, is taken away. The heat may be dissipated by means of the cooling tower 53. After heat exchange by the plate heat exchanger unit 3 of the present disclosure, a high-temperature medium may be recycled for heating. Recovery and reutilization of heat are achieved. The regulating valve 33 is capable of regulating and controlling a volume of available waste heat. If heating is insufficient, the plate heat exchanger unit 3 simultaneously enables water intake for heating to meet a normal heating requirement. In this case, heat supplied by the plate heat exchanger unit 3 for cooling and heat dissipation may be used as a heat supplement to an overall heat supply unit. The recovery and reutilization of heat may produce a certain economic benefit. A cost of the structure is reduced. A cost per unit computation power is reduced to a certain extent, and the competitive advantage of the product is improved.

The computational power server cabinet system 1 includes a plurality of modules arranged in parallel. In the present disclosure, the computational power server cabinet system 1 includes 5 modules: No. 1 cabinet module, No. 2 cabinet module, No. 3 cabinet module, No. 4 cabinet module, and No. 5 cabinet module. The computational power server cabinet system 1 is formed into a cuboid structure as a whole and is provided with the water inlet pipe 51 on one side and the water return pipe 52 on the other side in a length direction thereof.

Each independent module includes a cabinet assembly 11, an electrical power distribution assembly 12, a switching assembly 13, and a water inlet and outlet assembly 14. The cabinet assembly 11 is of a frame structure made up of plates. A plurality of layers of server cabinets 15 are fixed from bottom to top within and locked to the cabinet assembly 11. A gap is formed between adjacent server cabinets 15. A server is fixedly arranged on each server cabinet 15. The water inlet and outlet assembly 14 is communicated with the water inlet pipe 51 and the water return pipe 52 respectively. A medium, when flowing, exchanges heat with the server cabinets 15 to take away heat released by the server cabinets 15. The switching assembly 13 is disposed at an upper end of the cabinet assembly 11 to independently control each independent module. That is, each module may be manipulated solely. A plurality of modules may operate simultaneously. Alternatively, multiple modules and a single module among a plurality of modules may be selectively switched on solely. Thus, the modules are selected according to a demand for computational power. On the premise that the demand is met, the energy consumption is minimized and more energy is saved. Moreover, a valve for controlling closing and opening of the pipe is disposed between the water inlet and outlet assembly 14 and the water inlet pipe 51, and a valve for controlling closing and opening of the pipe is disposed between the water inlet and outlet assembly 14 and the water return pipe 52. Equivalently, a heat exchange system may operate independently for each independent module. The electrical power distribution assembly 12 is configured to electrically connect the server cabinets 15 with the power distribution cabinet unit 4. A module current switch for controlling the operation of an entire module is disposed at an upper end of each module.

The water inlet and outlet assembly 14 includes a water inlet branch pipe 141 and two water outlet branch pipes 142. The two water outlet branch pipes 142 are defined as a first water outlet branch pipe 142 and a second water outlet branch pipe 142. Upper ends of the first water outlet branch pipe 142 and the second water outlet branch pipe 142 are communicated, where the first water outlet branch pipe 142 is communicated with a high-temperature medium outlet pipe on the server cabinet 15, and a lower end of the second water outlet branch pipe 142 is communicated with the water return pipe 52. The water inlet branch pipe 141 has a lower end connected to the water inlet pipe 51 and an upper end closed, and a side of the water inlet branch pipe 141 is communicated with a low-temperature medium inlet pipe of the server cabinet 15. A medium enters the server cabinet 15 through the water inlet branch pipe 141, and after heat exchange within the server cabinet 15, the medium enters the first water outlet branch pipe 142 from a high-temperature medium outlet pipe. A high-temperature medium then enters the second water outlet branch pipe 142 from the upper end thereof and subsequently flows out of the lower end thereof into the water return pipe 52. Thus, it can be guaranteed that paths along which the medium travels when cooling the server cabinets are the same, thereby ensuring uniform flow as much as possible. A continuous cooling effect can be guaranteed, and a better balance is achieved. More preferably, exhaust valves are disposed on the water inlet branch pipe 141, the first water outlet branch pipe 142 and the second water outlet branch pipe 142 to empty air in the pipes, thereby guaranteeing smooth flow of the medium, guaranteeing a density of the medium, avoiding excessive air from corroding the pipes and prolonging the service life of the pipes.

For example, the water inlet branch pipe 141 and the water outlet branch pipes 142 each have a height of 1.8 m. For a bottommost server cabinet 15, a medium flows in the water inlet branch pipe 141 by a height of 0 m, then rises in the first water outlet branch pipe 142 for a distance of 1.8 m, and falls in the second water outlet branch pipe 142 for a distance of 1.8 m, and a distance for the medium passing by the bottommost server cabinet 15 is 3.6 m. For an uppermost server cabinet 15, the medium flows in the water inlet branch pipe 141 for a distance of 1.8 m, flows in the first water outlet branch pipe 142 for a distance of 0 m, and falls in the second water outlet branch pipe 142 for a distance of 1.8 m, with a total distance of 3.6 m. Taking a middle server cabinet 15 for example, the medium rises and falls in the water inlet branch pipe 141 for a distance of 0.9 m, rises in the first water outlet branch pipe 142 for a distance of 0.9 m after heat exchange, and falls in the second water outlet branch pipe 142 for a distance of 1.8 m, with a total distance of 3.6 m. Therefore, during heat exchange of each server, a flowing distance of the medium is identical, allowing for constant balance of heat exchange and a balanced pressure to pipes and thus being conducive to the stability of the whole structure. Meanwhile, in combination with the water return pipe 52, the stability of the pressure in the pipes is further improved.

The electrical power distribution assembly 12 includes power distribution branches 121 and power distribution buses 122. One server cabinet 15 corresponds to one power distribution branch 121. A plurality of power distribution branches 121 in a same module are converged to a same power distribution bus 122, and a plurality of power distribution buses 122 in a plurality of modules are converged to a same main power distribution bus 8. The main power distribution bus 8 is disposed at an upper end of the computational power server cabinet system 1 and controlled by a main current switch 9. The main current switch 9 is disposed on the main power distribution bus 8. With the structure of the power distribution buses 122 and the main power distribution bus 8, large flow, convenient and precise installation, and more secure connection are achieved, and superfluous cables are not prone to appearing at a bottom end. This structure is also conducive to achieve UR certification and conducive to international sales of products. Moreover, with a parallel structure of a plurality of modules, the buses are simpler, and more compact in structure such that the utility rate of space is increased and a traditional wiring manner is broken through.

With the above modular structure, modules are mounted from bottom to top layer by layer, and individual layers are independent of each other. After being mounted and fixed, the modules substantially do not need to be moved. The modules are stacked layer by layer. When disassembling, only a small part needs to be changed. That is, an independent server cabinet 15 is replaced without removing other parts. A higher utility rate of space is achieved. Moreover, it is more convenient for an assembler to operate, and the efficiency of assembling is improved. Furthermore, each module may be mounted in advance outside a container 7. A plurality of modules may be mounted simultaneously such that the efficiency of assembling is improved. The rated flow of the present system is 900 KW, and the main current switch operates at 1600 A.

In the present disclosure, the main power distribution bus 8 is bared. A cooling medium in the present disclosure is water. It needs to be guaranteed that the bus operates normally in case of medium water leakage. For this part, a corresponding structure is also provided in the present disclosure. A back plate 16 and a tray 17 are further disposed in the cabinet assembly 11. The back plate 16 is disposed on a side of the water inlet and outlet assembly 14. The back plate 16 has a lowermost end below an upper end of the water inlet and outlet assembly 14 and an uppermost end above the upper end of the water inlet and outlet assembly 14. The uppermost end of the back plate 16 is disposed close to the upper end of the cabinet assembly 11. The tray 17 is disposed at the upper end of the uppermost server cabinet 15 in each of the modules. The back plate 16 is provided to effectively prevent a leaking medium from splashing on the main power distribution bus 8 and the tray 17 is provided to receive a medium and guide the flow of the medium to a certain extent in case of a large quantity of the medium, thus avoiding the main power distribution bus 8 from being affected while protecting a protector to a certain extent. No sealed space is formed by isolation with the back plate 16 and the tray because sealing may affect the heat dissipation performance. Meanwhile, it needs to be guaranteed that medium leakage may not affect the main power distribution bus 8. Under the premise of guaranteeing not sealing, protection is carried out. When water leaks, the water may not splash on the bus even though the water is accumulated therebelow. The safety performance is improved and a potential safety hazard is avoided, which are crucial and also are important requirements for the application of a bus.

In the present disclosure, a plurality of containers 7 may also be arranged in parallel. A plurality of containers 7 may be coupled to a main current control bus. A plurality of containers 7 may be controlled simultaneously, and a single container 7 may also be controlled respectively.

The liquid cooling system 5 includes a cooling tower 53, a water inlet pipe 51, a water return pipe 52, and a water distribution and collection pipe 54. The cooling tower 53 is configured to continuously supply a low-temperature medium, realizes heat exchange of high-temperature and low-temperature mediums and dissipates heat. The cooling tower 53 supplies the low-temperature medium to the computational power server cabinet system 1 through the water inlet pipe 51, and the low-temperature medium enters the computational power server cabinet system 1 through the water distribution and collection pipe 54 and finally returns to the cooling tower 53 through the water return pipe 52. A main filter 511, a turbine flowmeter 512, a pressure transmitter 515 and a temperature transmitter 513 are disposed on the water inlet pipe 51. The main filter 511 is configured to filter out impurities in the medium to guarantee the purity of the medium so that the medium can be reused. On the one hand, the cooling effect is avoided from being affected; and on the other hand, pipes are avoided from being affected. The pressure transmitter 515 is configured to monitor a pressure and upload the pressure to the power distribution cabinet unit 4 timely, thereby realizing control on the pressure of the water inlet pipe 51, avoiding pipe explosion due to an excessive pressure and improving the safety performance. The temperature transmitter 513 is adapted to monitor a water inlet temperature and upload the water inlet temperature to the power distribution cabinet unit 4 timely, thereby realizing the control on the temperature of the water inlet pipe 51 and guaranteeing the cooling effect. A pressure transmitter 515 and a temperature transmitter 513 are also disposed on the water return pipe 52 and function the same as those on the water inlet pipe 51.

The cooling tower 53 is a closed wet cooling tower 53. At a wet bulb temperature of 28° C. (dry bulb temperature of 36° C.), a heat dissipation capacity is greater than or equal to 900 KW (an allowance of 10%, and a maximum heat dissipation quantity of 1 MW), a flow rate is greater than or equal to 65 $m^3$/h, and a pressure loss is less than or equal to 50 kPa. A material in contact with a cooling medium is 304 stainless steel and the like. A fun on the cooling tower and a water pump both operate at a fixed frequency.

The electrical apparatus elements for monitoring the parameters are commercially available. Alternatively, other electrical apparatus elements with this function on the market may also be used to replace the parts in the present disclosure. This belongs to the technical means well known to those skilled in the art and falls within the protection scope of the present disclosure. The operating principles of part of commercially available electrical apparatus elements are explained below. The operating principle of a single part is well-known. However, there are different setting requirements in different application environments, and it is not well-known how to set and how a plurality of electrical apparatus elements coordinate with one another.

The pressure transmitter 515 is a device for converting a pressure into a pneumatic signal or an electric signal for control and remote transmission. The temperature transmitter uses a thermocouple or a thermal resistor as a temperature measuring element. A signal is output from the temperature measuring element to a transmitter module, processed by circuits of voltage-stabilized filtering, operational amplification, nonlinear correction, V/I conversion, constant current and reverse direction protection and the like to be converted into a 4-20 mA current signal or 0-5 V/0-10 V voltage signal in a linear relationship with the temperature, and output as an RS485 digital signal. That is, the temperature transmitter is a device that converts the temperature into an electric signal for control and remote transmission. The pressure transmitter 515 and the temperature transmitter in the present disclosure are both electrically connected to a power distribution cabinet unit 4 to monitor the temperature and the pressure and to control and regulate the temperature and the pressure timely.

The turbine flowmeter 512 is a current-type flow measuring instrument having a temperature and pressure compensation function.

A cooling medium may be replaced at a low temperature. At a low temperature, the cooling medium is changed to an oil or other mediums, and the medium oil has better low temperature resistance. In case of a low temperature, the medium oil does not freeze and may maintain liquidity. In most cases, the cooling medium may be water. Water cooling exhibits a better heat dissipation effect and is lower in cost than oil cooling. With the same system, different mediums may be replaced to meet the requirements of cooling in different environments. The range of application is wider. A medium may be adjusted to other mediums according to specific application situations with a difference in cost. It would be easy for a person skilled in the art to conceive of selecting a medium according to a situation. For example, when a test is conducted in winter, a mixed liquid of ethylene glycol and pure water is used for the test. Water cooling is an option with the best cost performance so far.

The water inlet pipe 51 and the water return pipe 52 are converged at lower ends of the modules of the computational power server cabinet system 1. The water inlet pipe 51 is detoured around a farthest module in the computational power server cabinet system 1 with a tail end thereof being located at a module closest to the cooling system, and enters each independent module of the computational power server cabinet system 1. Such a structure design is equivalent to that the water inlet pipe 51 is detoured. In a container 7 having a limited and compact space, the water inlet pipe 51 is detoured because of needs of reducing a pressure balance of water intake, reducing impact to the water return pipe 52, and avoiding problems such as piping during water intake, thereby being conducive to keep a pressure balanced in the water return pipe 52. It is significantly helpful for the safety and the service life of the water inlet pipe 51 to keep a constant water intake velocity.

A water supplementing assembly 6 is further disposed between the water inlet pipe 51 and the water return pipe 52 to communicate the two pipes. The water supplementing assembly 6 includes a water supplementing pipe 61 having one end disposed between the main filter 511 of the water inlet pipe 51 and the computational power server cabinet system 1 and the other end disposed between the computational power server cabinet system 1 and a main circulating water pump 21. A water supplementing tank 62, a liquid supplementing filter, a liquid supplementing pump, a check valve 65 and an electric ball valve are disposed in sequence from the water inlet pipe 51 to the water return pipe 52 on the water supplementing pipe 61. A safety valve 66 is disposed between the water supplementing tank 62 and the water inlet pipe. When a pressure in the water inlet pipe 51 is too high, a low-temperature medium enters the water supplementing tank 62 through the safety valve 66. Meanwhile, water in the water supplementing tank 62 may also be added manually. If a pressure in the water return pipe 52 is too low, the liquid supplementing pump is started and the electric ball valve is opened. The medium in the water supplementing tank 62 enters the water return pipe 52 through the check valve 65 and the electric ball valve after passing through the liquid supplementing filter. The water supplementing pipe 61 is provided to guarantee a balance between the pressure in the water inlet pipe 51 and the pressure in the water return pipe 52. More preferably, the water supplementing tank 62 is provided with a liquid adding and discharging port to adjust a volume of the liquid in the water supplementing tank 62.

The safety valve 66 is an opening-closing component that is in a normally closed state under the action of an external force. The safety valve is a special valve configured to, when a pressure of a medium in a device or a pipe rises to exceed a specified value, prevent the pressure of the medium in the device or the pipe from exceeding the specified value by discharging the medium to the outside of the system.

The pump station control system 2 controls start and stop of a fun on the cooling tower according to a temperature transmitter on a main liquid supply pipe and an outdoor temperature, but does not control a running state of the fun on the cooling tower. In an automatic mode, after a local start command or a remote start command is received, the liquid cooling system 5 starts automatically, and monitors a running status of the liquid cooling system 5 and detects a system failure according to setting parameters. A control cabinet unit performs control by using a PLC program. The PLC automatically adjusts the temperature of the cooling water and the system pressure, and locally displays that the parameters of the liquid cooling system 5 are out of limit timely, and an error signal light is on.

A pump station control system includes the main circulating water pump 21 which is disposed on the water return pipe 52. A power of the main circulating water pump is selected according to a medium flow rate and a medium transport path. The power of the main circulating water pump is determined, and a specification of the main circulating water pump is determined according to the power. In the present disclosure, a certain requirement is imposed on model selection, and multiple factors are taken into account. A total power is greater than a theoretically calculated power, and the safety coefficient is more than 1.5 times of the theoretically calculated safety coefficient. When the water pump operates at full frequency, it vibrates greatly. In the present disclosure, a high-power water pump is selected. The water pump is selected to operate at a low frequency to reduce vibration, guaranteeing better stability within the whole system. The performance of each component is more reliable, and the vibration of the whole container is reduced.

The maximum overall dimensions of a single container 7 are L6058×W2438×H2896 (mm), which meet the certification requirements of China classification society and UL. The overall protection grade of the container 7 is IP53, and a material thereof is SPA-H steel plate or similar weather-resistant steel plate. The corrosion-proof grade is C3. All door frame waterproof plates are sealed without leakage, and the bottom is designed with an overhead electrostatic floor. More preferably, a fan 71 is further disposed on the container 7 to realize air flowing inside and outside the container 7, and a small quantity of heat is dissipated in this manner. Still further, a temperature and humidity transmitter 72 is further disposed on the container 7 to monitor the temperature and the humidity. Leakage detection transmitters 73, also referred to as leakage current transmitters, are disposed on two sides of the container 7, respectively, and transmit electric signals to an electric control cabinet unit to realize detection of the current, avoid current leakage and guarantee the safety. A leakage current transmitter is a device that converts measured AC microcurrent and DC isolation into standard analog signals or RS485 digital signals such as linearly proportional DC current and DC voltage according to the operating principles of electromagnetic isolation and magnetic modulation of a mutual inductor, and is widely applied to monitor the insulations of buses and branches of DC and AC power supply systems in real time.

The power distribution cabinet unit 4 provides the liquid cooling system 5 with AC power of three-phase four-wire 415V+10% and 60 Hz, and reliable earthing is provided in field application. Meanwhile, the power distribution cabinet unit 4 serves as a control center to receive information transmitted by each electrical apparatus elements and perform control and adjustment according to transmitted signals to ensure operation stability and safety of a device. A control cabinet power source and the like in the computational power server cabinet system 1 gain power from a main power distribution cabinet. A 1600 A main current control switch is provided in the present disclosure. Providing a main switch is also a key for implementing the present structure.

Figure 13:
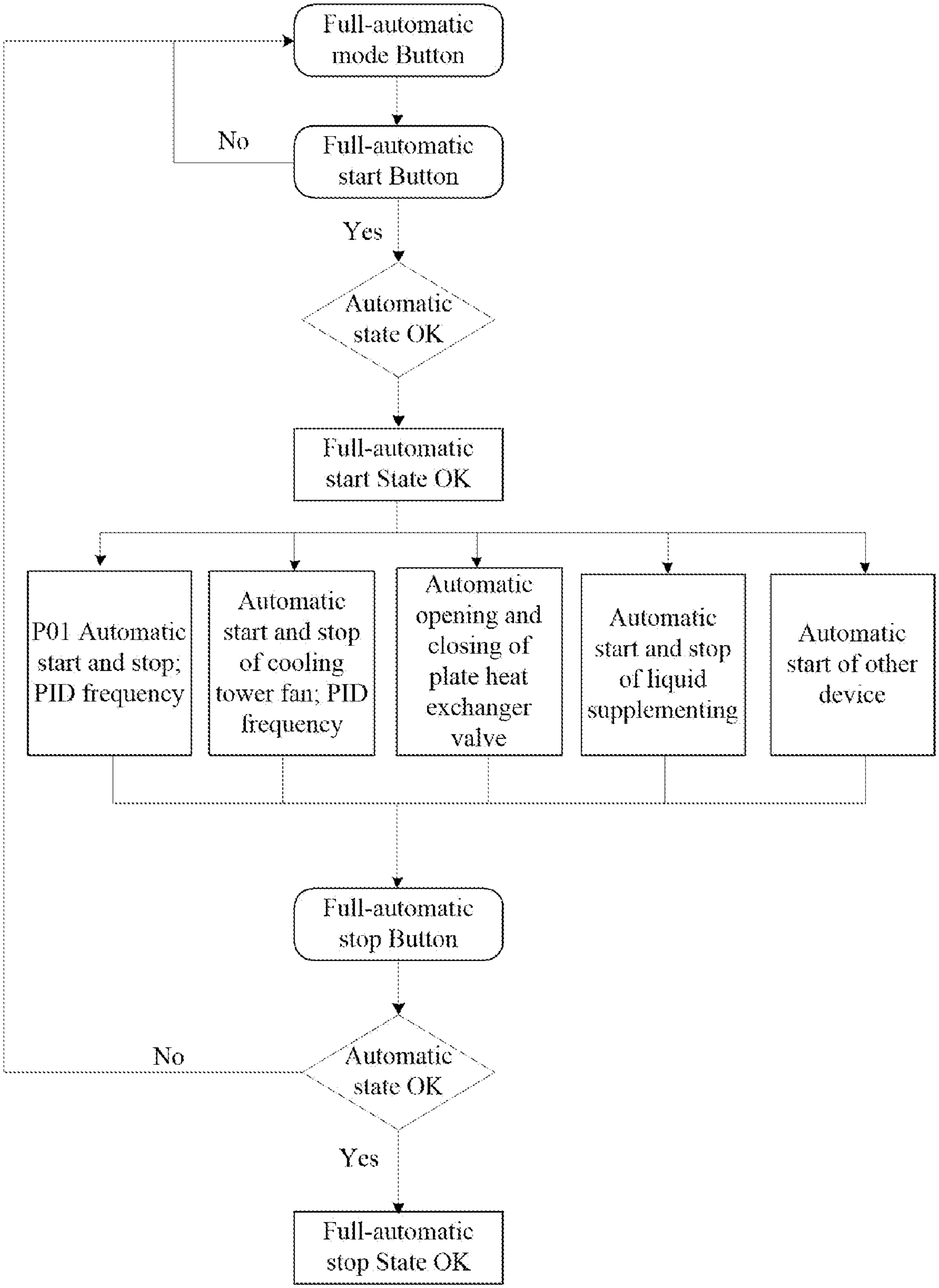
FIG. 13 is a logic control diagram of a control method of a containerized liquid-cooling data center according to the present disclosure.

As shown in FIG. 13, a control method of a containerized liquid-cooling data center includes the following steps.

Operation modes of a liquid cooling control system include a manual mode and an automatic mode, which are achieved on a touch screen of a control cabinet unit.

In the manual mode, devices such as a main circulating water pump 21, a liquid supplementing pump, a fan 71 on a container 7, a fan 71 on a cooling tower 53 and a spray pump on the cooling tower 53 are started and stopped manually. The spray pump is a part of the cooling tower 53.

In an automatic operating mode, after a local start command or a remote start command is received, a liquid cooling system 5 starts automatically, and monitors a running status of the liquid cooling system 5 and detects a system failure according to setting parameters; a programmable logic controller (PLC) monitors a temperature of cooling water and a system pressure, and locally displays that the parameters of the liquid cooling system 5 are out of limit timely, and an error signal light is on; and locally displays that the parameters seriously out of limit possibly affects safe operation of a cooled device, an error alerting signal light is on to automatically give an alert; and a control cabinet unit performs formal debugging according to the alert to realize optimization and improvement.

The main circulating water pump 21, the liquid supplementing pump, the fun on the cooling tower and the like are automatically controlled by the PLC according to actual operating conditions.

A pump station control system 2 controls start and stop of the fun on the cooling tower according to a temperature of a temperature transmitter 513 on a water inlet pipe 51 and an outdoor temperature transmitter, but does not control a running state of the fun on the cooling tower.

In the automatic mode, after a local start command or a remote start command is received, the liquid cooling system 5 starts automatically, and monitors a running status of the liquid cooling system 5 and detects a system failure according to setting parameters. The PLC automatically adjusts the temperature of the cooling water and the system pressure, and locally displays that the parameters of the liquid cooling system 5 are out of limit timely, and the error signal light is on.

The modes are switched as follows:

Full-automatic Button→Full-automatic Button OK;

→Full-automatic start Button→Full-automatic start state OK;

→Full-automatic stop Button→Full-automatic stop state OK.

Full-Automatic Start State OK:

1. The main circulating water pump 21 starts automatically; and the control cabinet unit controls a frequency by means of a proportional-integral-derivative (PID) controller, compares a set value with a reference value, and performs flow rate control according to a comparison result.

2. The fun on the cooling tower starts automatically; and the control cabinet unit controls a frequency by means of the PID controller, compares a set value with a reference value, and performs temperature control according to a comparison result;

2.1. The spray pump on the cooling tower 53 is automatically turned on when a temperature of a temperature transmitter in the cooling tower 53 is greater than a set value and automatically turned off when the temperature of the temperature transmitter is lower than the set value.

3. A butterfly valve on a water return pipe 52 is automatically opened when a temperature of a temperature transmitter on the water return pipe 52 is greater than a set value and automatically closed when the temperature of the temperature transmitter on the water return pipe 52 is lower than the set value; and a butterfly valve on a bypass pipe is automatically opened and closed counter to the butterfly valve on the water return pipe.

4. The liquid supplementing pump is automatically started to supplement a liquid when a pressure of a pressure transmitter 515 on the water inlet pipe 51 is greater than a set value and automatically stopped when the pressure of the pressure transmitter 515 on the water inlet pipe 51 is lower than the set value; and a ball valve on a water supplementing pipe 61 is opened and closed in a same direction with the liquid supplementing pump.

5. A fan 71 in the container 7 and a temperature and humidity transmitter disposed in the container are automatically turned on when a temperature and a humidity of the temperature and humidity transmitter are greater than set values and automatically turned off when the temperature and the humidity of the temperature and humidity transmitter are lower than the set values.

The pump station control system 2 controls start and stop of a fun on the cooling tower according to a temperature transmitter on a main liquid supply pipe and an outdoor temperature, but does not control a running state of the fun on the cooling tower. In an automatic mode, after a local start command or a remote start command is received, the liquid cooling system 5 starts automatically, and monitors a running status of the liquid cooling system 5 and detects a system failure according to setting parameters. An electric cabinet control unit performs control by using a PLC program. The PLC automatically adjusts the temperature of the cooling water and the system pressure, and locally displays that the parameters of the liquid cooling system 5 are out of limit timely, and an error signal light is on.

A liquid cooling control cabinet locally sets state display lights with respect to running, an error and the like of a circulating liquid cooling system to indicate a running state of a current device and provide short circuit, overcurrent and overvoltage protection for a pump. An emergency stop button is disposed on a cabinet door. Failure state information is uploaded. A control circuit uses a PLC programmed control protection system to realize: monitoring and protection on the liquid cooling system 5, uploading of an operating status of the liquid cooling system 5 to a main controller, and remote control on the liquid cooling system 5. A remote control signal with a high requirement for instantaneity and an alerting signal of the liquid cooling system 5 are transmitted remotely. The liquid cooling system 5 is in communication with a monitoring system for a cooled device through a switch quantity contact. An online parameter with a large amount of information, device state monitoring and alerting information of the liquid cooling system 5 are in communication with a monitoring system for the high-performance computational power server cabinet system 1 through MODBUS communication protocol by means of an RS485 interface or a TCP interface.

The present disclosure relates to integrated containerized liquid cooling equipment, which provides a good heat dissipation processing scheme for a cold-plate type liquid-cooled server cabinet and has a waste heat recovery port. By cold-plate type liquid cooling, heat is transferred to a cooling liquid in a circulating pipe, and heat released by the server cabinet is taken away by means of the cooling characteristic of the liquid itself. The cooling efficiency of the cold plate is improved, and the energy consumption of the system is significantly reduced.

The foregoing is detailed description of one embodiment of the present disclosure, which is merely a preferred embodiment of the present disclosure and cannot be construed as limiting the scope of implementation of the present disclosure. Any equivalent modifications, improvements, etc. made within the application scope of the present disclosure should fall within the protection scope of the present disclosure.

What is claimed is:

1. A containerized liquid-cooling data center for a cabinet-type plate cooling system, comprising a computational power server cabinet system, a pump station control system, a plate heat exchanger unit and a power distribution cabinet unit that are disposed within a container, and a liquid cooling system disposed outside the container;

- wherein the computational power server cabinet system comprises a plurality of modules operating independently, each of the plurality of modules comprises a plurality of server cabinets each corresponding to a power distribution branch; a plurality of power distribution branches in a same module are converged to a same power distribution bus, and a plurality of power distribution buses in the plurality of modules are converged to a same main power distribution bus, and a current switch is disposed on the main power distribution bus to control the main power distribution bus;
- the liquid cooling system cools and dissipates heat of the computational power server cabinet system through circulation of a medium;
- the plate heat exchanger unit, as a bypass branch of the liquid cooling system, is configured to recover waste heat and undertake part or all of a heat exchange function of the liquid cooling system; and
- the pump station control system provides power for the circulation of the medium.

2. The containerized liquid-cooling data center according to claim 1, wherein each of the plurality of modules comprises a cabinet assembly, an electrical power distribution assembly, a switching assembly, and a water inlet and outlet assembly; the cabinet assembly is of a frame structure, in which a plurality of server cabinets are placed; a gap is formed between adjacent server cabinets; the water inlet and outlet assembly is communicated with a water inlet pipe and a water return pipe respectively; a first valve is disposed between the water inlet and outlet assembly and the water inlet pipe, and a second valve is disposed between the water inlet and outlet assembly and the water return pipe; and the electrical power distribution assembly is configured to electrically connect the server cabinets with the power distribution cabinet unit.

3. The containerized liquid-cooling data center according to claim 2, wherein the water inlet and outlet assembly comprises a water inlet branch pipe and two water outlet branch pipes; the two water outlet branch pipes are defined as a first water outlet branch pipe and a second water outlet branch pipe; upper ends of the first water outlet branch pipe and the second water outlet branch pipe are communicated, the first water outlet branch pipe is communicated with a high-temperature medium outlet pipe of the server cabinets; a lower end of the second water outlet branch pipe is communicated with the water return pipe; the water inlet branch pipe has a lower end connected to the water inlet pipe and an upper end closed, and a side of the water inlet branch pipe is communicated with a low-temperature medium inlet pipe of the server cabinets; the medium enters the server cabinets through the water inlet branch pipe, and after heat exchange within the server cabinet, the medium enters the first water outlet branch pipe from the high-temperature medium outlet pipe, and then enters the second water outlet branch pipe from the upper end thereof and subsequently flows out of the lower end thereof into the water return pipe.

4. The containerized liquid-cooling data center according to claim 2, wherein the cabinet assembly further comprises a back plate and a tray; the back plate is disposed on a side of the water inlet and outlet assembly; the back plate has a lowermost end below an upper end of the water inlet and outlet assembly and an uppermost end above the upper end of the water inlet and outlet assembly; and the tray is disposed at an upper end of an uppermost server cabinet in each of the plurality of modules.

5. The containerized liquid-cooling data center according to claim 1, wherein the liquid cooling system comprises a cooling tower, a water inlet pipe, a water return pipe, and a water distribution and collection pipe; the cooling tower supplies a low-temperature medium to the computational power server cabinet system through the water inlet pipe, and the low-temperature medium enters the server cabinets of the computational power server cabinet system through the water distribution and collection pipe and finally returns to the cooling tower through the water return pipe; a main filter, a turbine flowmeter, a first pressure transmitter and a first temperature transmitter are disposed on the water inlet pipe; the main filter is configured to filter out impurities in the medium; the first pressure transmitter is configured to monitor a pressure and upload the pressure to the power distribution cabinet unit timely; the first temperature transmitter is adapted to monitor a water inlet temperature and upload the water inlet temperature to the power distribution cabinet unit timely; and a second pressure transmitter and a second temperature transmitter are disposed on the water return pipe; the second pressure transmitter is configured to monitor a pressure and upload the pressure to the power distribution cabinet unit timely; the second temperature transmitter is adapted to monitor a water outlet temperature and upload the water outlet temperature to the power distribution cabinet unit timely.

6. The containerized liquid-cooling data center according to claim 5, wherein the plate heat exchanger unit comprises a bypass pipe and a plate heat exchanger; the bypass pipe has one end communicated with the water return pipe and an other end communicated with the plate heat exchanger as a high-temperature medium inlet, and the one end connected to the water return pipe is disposed between a main circulating water pump and the cooling tower; the plate heat exchanger has two water outlets with one communicated with the water inlet pipe and an other one serving as a heating water outlet, and the one water outlet communicated with the water inlet pipe is disposed between the main filter and the cooling tower; a regulating valve is disposed on a pipe where the heating water outlet is located to control a heating flow rate; and the plate heat exchanger unit further has a heating water inlet for communicating with a supplemental heat source.

7. The containerized liquid-cooling data center according to claim 5, wherein the water inlet pipe and the water return pipe are converged at lower ends of the modules of the computational power server cabinet system; the water inlet pipe is detoured around a farthest module in the computational power server cabinet system with a tail end thereof being located at a module closest to the cooling system, and enters each independent module of the computational power server cabinet system.

8. The containerized liquid-cooling data center according to claim 5, wherein a water supplementing assembly is further disposed between and communicated with the water inlet pipe and the water return pipe; the water supplementing assembly comprises a water supplementing pipe having one end disposed between the main filter of the water inlet pipe and the computational power server cabinet system and an other end disposed between the computational power server cabinet system and a main circulating water pump; a water supplementing tank, a liquid supplementing filter, a liquid supplementing pump, a check valve and an electric ball valve are disposed in sequence on the water supplementing pipe between the water inlet pipe and the water return pipe; and a safety valve is disposed between the water supplementing tank and the water inlet pipe.

* * * * *